(12) United States Patent
Muenz (10) Patent No.: US 10,656,411 B2
(45) Date of Patent: May 19, 2020

(54) OPTICAL SYSTEM FOR FIELD MAPPING AND/OR PUPIL MAPPING

(71) Applicant: Carl Zeiss SMT GmbH, Oberkochen (DE)

(72) Inventor: Holger Muenz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 30 days.

(21) Appl. No.: 15/927,647

(22) Filed: Mar. 21, 2018

(65) Prior Publication Data
US 2018/0210192 A1    Jul. 26, 2018

Related U.S. Application Data (63) Continuation of application No. PCT/EP2016/070537, filed on Aug. 31, 2016.

(30) Foreign Application Priority Data

Sep. 24, 2015   (DE) .................. 10 2015 218 328

(51) Int. Cl.
| | | |
|---|---|---|
| *G02B 9/34* | (2006.01) | |
| *G02B 27/00* | (2006.01) | |
| *G03F 7/20* | (2006.01) | |
| *G02B 13/14* | (2006.01) | |
| *G02B 13/00* | (2006.01) | |
| *G02B 5/18* | (2006.01) | |

(52) U.S. Cl.
CPC ....... *G02B 27/005* (2013.01); *G02B 13/0035* (2013.01); *G02B 13/14* (2013.01); *G03F 7/70241* (2013.01); *G02B 5/1814* (2013.01); *G02B 27/0043* (2013.01)

(58) Field of Classification Search
CPC ............. G02B 27/005; G02B 13/0035; G02B 5/1814; G02B 27/0043; G03F 7/70241
USPC ................. 359/686, 715, 753, 771
See application file for complete search history.

(56) References Cited

U.S. PATENT DOCUMENTS

| 2,698,555 | A | | 1/1955 | McCarthy |
| 4,009,942 | A | * | 3/1977 | Hirose ................ G02B 15/14 359/691 |

(Continued)

FOREIGN PATENT DOCUMENTS

| CN | 104126112 A | 10/2014 |
| CN | 104516096 A | 4/2015 |

(Continued)

OTHER PUBLICATIONS

German Office Action, with translation thereof, for corresponding Appl No. 10 2015 218 328.9, dated May 24, 2016.

(Continued)

*Primary Examiner* — William Choi
(74) *Attorney, Agent, or Firm* — Fish & Richardson P.C.

(57) ABSTRACT

An optical system for field imaging and/or pupil imaging has an optical axis, a stop plane and an image plane. The optical system includes a lens element system that has three lens element groups, each including at least one lens element. The lens element groups are spaced apart from each other along the optical axis between the stop plane and the image plane. The three lens element groups have a first lens element material and/or a second lens element material that differs from the first lens element material.

20 Claims, 3 Drawing Sheets

(56) References Cited

U.S. PATENT DOCUMENTS

| | | |
|---|---|---|
| 5,754,340 A | 5/1998 | Ushida et al. |
| 5,835,285 A | 11/1998 | Matsuzawa et al. |
| 5,914,823 A | 6/1999 | Yamamoto |
| 5,990,926 A | 11/1999 | Mercado |
| 6,459,534 B1 | 10/2002 | Kato et al. |
| 10,048,119 B2 | 8/2018 | Lauret |
| 2002/0039175 A1 | 4/2002 | Shafer et al. |
| 2003/0048547 A1 | 3/2003 | Schuster |
| 2003/0063393 A1* | 4/2003 | Omura ............... G02B 13/143 359/649 |
| 2006/0221460 A1 | 10/2006 | Saruwatari |
| 2015/0043064 A1 | 2/2015 | Shi et al. |

FOREIGN PATENT DOCUMENTS

| | | |
|---|---|---|
| DE | 101 13 612 A1 | 9/2002 |
| EP | 1 235 092 A2 | 8/2002 |
| JP | S6190115 A | 5/1986 |
| JP | H07294808 | 11/1995 |
| JP | H08190047 A | 7/1996 |
| JP | H1197347 A | 4/1999 |
| JP | 2000356741 A | 12/2000 |
| JP | 2002323652 A | 11/2002 |
| JP | 2003075720 A | 3/2003 |
| JP | 2004524554 A | 8/2004 |
| JP | 2013161076 A | 8/2013 |
| JP | 2014194494 A | 10/2014 |
| WO | WO0169298 A1 | 9/2001 |
| WO | WO 2006/091181 A1 | 8/2006 |

OTHER PUBLICATIONS

International Preliminary Report on Patentability for corresponding PCT Appl No. PCT/EP2016/070537, dated Apr. 5, 2018.

C. G. Wynne: A comprehensive first-order theory of chromatic aberration Secondary spectrum correction without special glasses; Optica Acta, 1978, vol. 25, No. 8, 627-636.

International Search Report for corresponding PCT Appl No. PCT/EP2016/070537, dated Jan. 3, 2017.

Japanese Examination Report, with translation thereof, for corresponding Appl No. 2018-515553, dated Aug. 20, 2019.

Chinese Examination Report, with translation thereof, for corresponding CN 201680062181.8, dated Jan. 10, 2020.

* cited by examiner

| Face | Radius [mm] | Thickness [mm] | Material |
|---|---|---|---|
| Stop | 0.000 | 52.457 | |
| 22a | 17.202 | 2.000 | Quartz glass |
| 22b | 51.800 | 10.391 | |
| 24a | 43.167 | 2.000 | Quartz glass |
| 24b | 8.873 | 1.691 | |
| 26a | 9.765 | 2.000 | CaF2 |
| 26b, 28a | -11.408 | 2.000 | Quartz glass |
| 28b | 18.073 | 49.910 | |
| 30a | 58.317 | 2.000 | Quartz glass |
| 30b | -56.628 | 23.018 | |
| 32a | 156.628 | 2.000 | CaF2 |
| 32b, 34a | -14.951 | 2.000 | Quartz glass |
| 34b | 61.543 | 26.465 | |
| Image | 0.0000 | 0.000 | |

Fig. 3

| Face | Radius [mm] | Thickness [mm] | Material |
|---|---|---|---|
| Stop | 0.000 | 26.465 | |
| 54a | -61.543 | 2.000 | Quartz glass |
| 54b, 56a | 14.951 | 2.000 | CaF2 |
| 56b | -156.625 | 23.018 | |
| 58a | 56.628 | 2.000 | Quartz glass |
| 58b | -58.317 | 49.91 | |
| 60a | -18.073 | 2.000 | Quartz glass |
| 60b, 62a | 11.408 | 2.000 | CaF2 |
| 62b | -9.765 | 1.691 | |
| 64a | -8.873 | 2.000 | Quartz glass |
| 64b | -43.167 | 10.391 | |
| 66a | -51.8 | 2.000 | Quartz glass |
| 66b | -17.202 | 52.457 | |
| Image | 0.000 | 0.000 | |

Fig. 4

| | Wavelength [nm] | 190 | 210 | 250 |
|---|---|---|---|---|
| Field imaging | Focal position in the image on the axis [μm] | -1.7 | 1.1 | -2.3 |
| | Focal position in the image (field edge) [μm] | 1.4 | -0.5 | 1.7 |
| | Transverse chromatic aberration in the image [nm] | 18.9 | 17.5 | -36.4 |
| Pupil imaging | Focal position on the object side [μm] | -1.7 | 1.1 | -2.3 |
| | Focal position on the object side (pupil edge) [μm] | 1.3 | -0.6 | 1.5 |
| | Transverse chromatic aberration on the object side [nm] | 20.8 | 16.0 | -36.9 |

Fig. 5

OPTICAL SYSTEM FOR FIELD MAPPING AND/OR PUPIL MAPPING

CROSS-REFERENCE TO RELATED APPLICATIONS

The present application is a continuation of, and claims benefit under 35 USC 120 to, international application PCT/EP2016/070537, filed Aug. 31, 2016, which claims benefit under 35 USC 119 of German Application No. 10 2015 218 328.9, filed on Sep. 24, 2015. The entire disclosure of these applications are incorporated by reference herein.

FIELD

The disclosure relates to an optical system for field imaging and/or pupil imaging, with an optical axis, a stop plane and an image plane, with a lens element system that has three lens element groups, each with at least one lens element, the lens element groups being arranged spaced apart from one another along the optical axis between the stop plane and the image plane, wherein the three lens element groups have a first lens element material and/or a second lens element material that differs from the first lens element material.

BACKGROUND

WO 2006/091181 A1 discloses an optical system.

By way of example the optical system is used for optical imaging, in particular field imaging and/or pupil imaging, which play a substantial role in microscopy and microlithography. The optical properties of the microscopic or microlithographic apparatuses depend primarily on the quality of the optical imaging with the optical system present there.

A typical optical system for optical imaging regularly has at least one optical element, which consists of at least one light-transmissive material. This material has a refractive index that depends on the wavelength of the light incident on the optical element. This wavelength-dependence of the refractive index, which is also referred to as dispersion, leads to chromatic aberrations in refractive optical elements, for example in an optical lens element which has a characteristic focal position in respect of a certain wavelength. Chromatic aberrations are understood to be optical aberrations that can be traced back to the wavelength-dependent refractive power of the lens element. The wavelength-dependence of the focal position of an optical lens element arises on account of light with different wavelengths or colors being refracted to a different extent by the optical lens element. In photography, green and red color fringes arise in recordings, in particular at light/dark transitions, the color fringes being referred to as transverse chromatic aberrations, with the image additionally appearing out of focus, which is known as a longitudinal chromatic aberration.

These chromatic aberrations can be subdivided further into so-called primary and secondary aberrations. If an aberration relates only to the differences in the imaging in the case of two different wavelengths, it is a primary aberration, while aberrations relating to more than two wavelengths are secondary aberrations.

In order to counteract chromatic aberrations, use is made of an achromat in order to obtain an identical focal position for different wavelengths. However, using a simple achromat made out of two different materials, it is generally only possible to obtain an identical focal position for two wavelengths. Here, the primary longitudinal chromatic aberration and the primary transverse chromatic aberration can be corrected by this achromat. However, the focus of a wavelength lying therebetween deviates to a greater or lesser extent from this focal position depending on the dispersion properties of the employed materials. In the case of very high demands in microscopy or microlithography, it is desirable, in particular, to also correct the secondary longitudinal chromatic aberration (also referred to as the secondary spectrum).

These days, the secondary spectrum can be minimized by apochromatic lens elements, with a skillful selection of the lens element materials, in particular of those with anomalous partial dispersion, having to be made. Partial dispersion is understood to be the ratio of the differences between the refractive index of one lens element material in respect of two different wavelength pairs, with different lens element materials having different partial dispersion characteristics. However, this option does not exist in the UV range, in which only very few optical materials are available. Therefore, U.S. Pat. No. 5,754,340 proposes to reduce the secondary spectrum by a combination of lens elements made out of quartz glass and/or calcium fluoride with a diffractive optical element, constituting a very complicated solution.

The literature has disclosed that the secondary spectrum can also be corrected if use is made of only two lens element materials, provided the design parameters of the system are selected appropriately. The publication C. G. Wynne, "A comprehensive first-order theory of chromatic aberration. Secondary spectrum correction without special glasses", Optica Acta: International Journal of Optics, 25 (1978), pages 627-636 constitutes an example hereof.

The document cited at the outset discloses a lens element system having three lens element groups which only consist of two lens element materials. The lens element system facilitates a sufficiently good correction of various aberrations, in particular of the secondary longitudinal chromatic aberration in the visible spectral range. However, only imaging from the object (here at infinity) into the image plane is corrected well in this case, as is conventional and sufficient in many applications, whereas the pupil imaging is uncorrected from a color point of view. By way of example, for the system shown in FIG. 1 of the aforementioned document with a focal length of approximately 560 mm and an aperture of 80 mm, the image-side angles of incidence for wavelengths of 436 nm and 656 nm differ by approximately 10% in the case of a field angle of 1° and an image height of 9.5 mm.

DE 101 13 612 A1 discloses a partial lens for illuminating an image field, in particular in an illumination device for a microlithographic projection exposure apparatus, wherein the partial lens consists of two lens element groups having one or two lens element materials. As a result, aberrations in field imaging and in pupil imaging are corrected. However, that secondary aberrations of the two imagings can likewise be corrected by the partial lens disclosed therein cannot be gathered from DE 101 13 612 A1.

SUMMARY

Therefore, the present disclosure seeks to develop an optical system that facilitates a color correction of the optical imaging that is as good as possible, with it being possible to remove aforementioned disadvantages.

According to the disclosure, the lens element system is a Fourier optical unit which additionally has one further lens element group with at least one lens element, the further lens element group being arranged at a distance from the three lens element groups along the optical axis between the stop plane and the image plane and having the first lens element material and/or the second lens element material, wherein two of the four lens element groups of the Fourier optical unit are embodied as a first and a second color under-corrected lens element group in relation to a chromatic longitudinal aberration of the field imaging and/or the pupil imaging, wherein two other of the four lens element groups of the Fourier optical unit are embodied as a first and a second color over-corrected lens element group, wherein the Fourier optical unit has an alternating sequence of in each case color under-corrected and color over-corrected lens element group.

Using the optical system according to the disclosure, it is possible to realize a Fourier optical unit for broadband applications in the UV range, in which, depending on desired properties, it is possible to correct the primary longitudinal chromatic aberration, the primary transverse chromatic aberration and the secondary longitudinal chromatic aberration for field imaging and pupil imaging. The optical system according to the disclosure is further advantageous in that it involves using only two lens element materials for the aforementioned chromatic corrections, with an additional advantage that, in addition to the primary chromatic aberrations, it is possible to correct the secondary chromatic aberration as well for at least one of the two imagings.

A Fourier optical unit is understood to mean an optical arrangement which images an object lying at infinity into an image plane situated at a finite distance and, at the same time, images the entrance pupil to infinity. To this end, a single lens element, which is referred to as a transformation lens element, is sufficient in the simplest case, wherein the entrance pupil and the image plane lie in the front and rear focal plane of the lens element, respectively.

U.S. Pat. No. 2,698,555 shows, quite generally, how the secondary spectrum can be corrected by a combination of a color over-corrected group and, at a distance therefrom, a color under-corrected group, with the under-corrected group preferably carrying the majority of the overall refractive power of the system.

The Fourier optical unit used in the optical system according to the disclosure is able to completely correct the aforementioned aberrations for both imagings. In particular, the optical system according to the disclosure facilitates a correction of the two imagings for the secondary spectrum that is better by at least a factor of 20 in comparison with an optical system, known from the prior art, made of a simple achromat. As a result, it is possible to substantially increase the imaging quality for microscopy or for microlithography using the optical system according to the disclosure, for example as an illumination system.

It is also possible, and this may be advantageous for the overall system, to produce a certain chromatic aberration in order to compensate the over-correction or under-correction of another partial system, wherein the object and image planes need not necessarily lie in an accessible manner outside of the partial system.

In a preferred configuration, the first and/or the second color under-corrected lens element group in each case has only one lens element, preferably a converging lens element with positive refractive power.

The advantage of this measure consists of this allowing the number of lens elements of at least one lens element group of the Fourier optical unit to be reduced to a minimum. Consequently, the outlay for producing the optical system according to the disclosure is reduced. A converging lens element with positive refractive power is usually under-corrected without specific correction measures, and so a converging lens element can be ideally used as a color under-corrected lens element group. Alternatively, or additionally, the first and/or the second color under-corrected lens element group may respectively have two lens elements in combination, it being possible for the lens elements to be cemented to one another.

In a further preferred configuration, the first and/or the second color under-corrected lens element group in each case has only one material, preferably the first or the second lens element material.

This measure is advantageous in that the number of lens element materials for producing the optical system according to the disclosure can likewise be reduced to a minimum. This is particularly advantageous in relation to the UV range, in which only very few optical materials are available. Further, this measure has a reducing effect on the production outlay and costs.

In a further preferred configuration, the first and/or the second color over-corrected lens element group each have at least two lens elements, preferably a converging lens element with a positive refractive power and a diverging lens element with a negative refractive power.

Advantageously, it is hereby possible to obtain an over-correction of an optical imaging by combining a converging lens element and a diverging lens element by virtue of these two lenses being arranged accordingly. As a result of this measure, it is possible to restrict the number of lens elements for a color over-corrected lens element group to two, which, on account of the currently more mature lens element production technique, can keep the production outlay for the optical system according to the disclosure low.

In a further preferred configuration, the first and/or the second color over-corrected lens element group in each case has two materials, preferably the first and the second lens element material. Preferably, the diverging lens element has the higher dispersion.

As a result of this measure, it is possible to restrict the number of lens element materials for the production of color over-corrected lens element groups to two, which is particularly advantageous in view of the few optical materials that are available for the UV range. Moreover, the procurement of the lens element materials for the production of both the color under-corrected and color over-corrected lens element groups of the optical system according to the disclosure can be carried out together, which additionally reduces the production outlay of the optical system according to the disclosure from an economical point of view.

In a further preferred configuration, the stop plane and an image field have substantially the same size if an object and/or an exit pupil are situated at an infinite distance from the stop plane.

Advantageously, this measure allows the field imaging and pupil imaging to be interchanged by reversing the Fourier optical unit about a normal to the optical axis. As a result, the optical system according to the disclosure provides the user with a Fourier optical unit with the particularly simple selection option for one of the two imagings, the field imaging or the pupil imaging, to be the one that is better corrected.

Here, the optical system according to the disclosure can be adapted particularly easily to an application with a finite object and/or exit pupil position. This is particularly advantageous since the range of application of the optical system according to the disclosure can be substantially extended thereby in order to meet the multifaceted demands in microscopy or in microlithography.

In a further preferred configuration, the first color under-corrected lens element group is disposed upstream of the second color under-corrected lens element group and upstream of the first and the second color over-corrected lens element groups, as seen from the stop plane, wherein, preferably, the first color under-corrected lens element group is embodied as a concave-convex converging lens element with positive refractive power, which has a convex face facing the stop plane, wherein, further preferably, the second color under-corrected lens element group is embodied as a biconvex converging lens element with positive refractive power.

Using this measure, it is possible to realize two color under-corrected lens element groups which only have one converging lens element in each case. In addition to the advantage that one converging lens element in each case is enough for the two color under-corrected lens element groups, this also allows the material selection to this end to be restricted to a certain lens element material, as a result of which there also is a low design and production outlay for the optical system according to the disclosure. Using a concave-convex converging lens element with positive refractive power as a first color under-corrected lens element group downstream of the stop plane along the optical axis, there further is the option of already being able to color under-correct light rays, in particular off axis light rays, sufficiently strongly by way of the first color under-corrected lens element group.

In a further preferred configuration, the first color over-corrected lens element group is disposed upstream of the second color over-corrected lens element group, as seen from the stop plane, wherein, preferably, the first color over-corrected lens element group has, in a sequence from the stop plane, a concave-convex diverging lens element with a concave face facing away from the stop plane, a biconvex converging lens element and a biconcave diverging lens element, wherein the biconvex converging lens element is joined to the biconcave diverging lens element at a distance from the concave-convex diverging lens element along the optical axis, wherein, further preferably, the second color over-corrected lens element group has, in a sequence from the stop plane, a biconvex converging lens element with a convex face facing away from the stop plane and a biconcave diverging lens element joined thereto along the optical axis, the biconcave diverging lens element having a concave face facing the stop plane.

Using this measure, it is possible to embody at least one color over-corrected lens element group of the Fourier optical unit of the optical system according to the disclosure by way of two lens elements, which keeps the design and production outlay of the optical system according to the disclosure low. Further, this renders it possible to limit the number of materials used for the production of the two color over-corrected lens element groups to two, which is advantageous for applications in the UV range, in which only very few optical materials are available.

In a further preferred configuration, the first color over-corrected lens element group is disposed upstream of the second color over-corrected lens element group and upstream of the first and the second color under-corrected lens element groups, as seen from the stop plane, wherein, preferably, the first color over-corrected lens element group has, in a sequence from the stop plane, a biconcave diverging lens element with a concave face facing away from the stop plane and a biconvex converging lens element joined thereto along the optical axis, the biconvex converging lens element having a convex face facing the stop plane, wherein, further preferably, the second color over-corrected lens element group has, in a sequence from the stop plane, a biconcave diverging lens element, a biconvex converging lens element and a concave-convex diverging lens element with a concave face facing the stop plane, wherein the biconvex converging lens element is joined to the biconcave diverging lens element at a distance from the concave-convex diverging lens element along the optical axis.

This measure is particularly advantageous since, using this, it is possible to form at least one color over-corrected lens element group of the Fourier optical unit of the optical system according to the disclosure by way of two lens elements such that the production of the optical system according to the disclosure can further be carried out in a cost-effective manner. Further, it is possible to restrict the number of materials used for the production of the two color over-corrected lens element groups to two, which is advantageous for applications in the UV range, in which only very few optical materials are available.

In a further preferred configuration, the first color under-corrected lens element group is disposed upstream of the second color under-corrected lens element group, as seen from the stop plane, wherein, preferably, the first color under-corrected lens element group is embodied as a biconvex converging lens element with positive refractive power, wherein, further preferably, the second color under-corrected lens element group is embodied as a concave-convex converging lens element with positive refractive power, which has a convex face facing away from the stop plane.

Using this measure, it is possible to realize two color under-corrected lens element groups which only have one converging lens element in each case. The material selection can be restricted to a certain lens element material, as a result of which the production of the optical system according to the disclosure can be made even more cost-effective.

In a further preferred configuration, the Fourier optical unit has silicon dioxide and/or calcium fluoride.

With reference to the optical system according to the disclosure, the use of these materials is particularly advantageous since they facilitate a Fourier optical unit, in particular for the UV range with the corresponding wavelengths.

In a further preferred configuration, the Fourier optical unit has at least one further optical element, for example a deflection mirror and/or a beam splitter.

By way of this measure, the optical system according to the disclosure is advantageous in that its range of application can be substantially extended thereby. In particular, the illumination beam path can be deflected by 90° with the aid of a deflection mirror. Alternatively, for measurement purposes, it is also possible to output couple some of the illumination light with the aid of a beam splitter. Further optical elements that facilitate further usage purposes can likewise be used on account of a sufficiently large distance between the aforementioned lens element groups of the Fourier optical unit.

Further advantages and features can be gathered from the following description and the attached drawing.

It goes without saying that the aforementioned features and those yet to be explained below may be used not only in the respectively specified combination but also in other combinations or on their own, without departing from the scope of the present disclosure.

BRIEF DESCRIPTION OF THE DRAWINGS

Exemplary embodiments of the disclosure are illustrated in the drawing and described in more detail below with reference thereto. In the drawing.

DETAILED DESCRIPTION OF EXEMPLARY EMBODIMENTS

Figure 1:
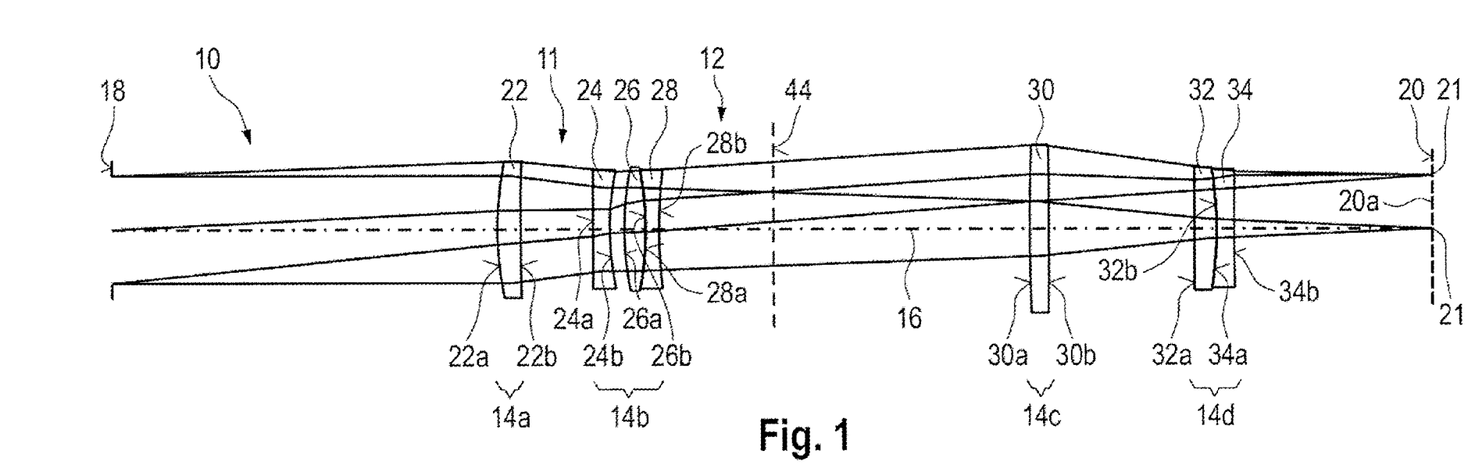
FIG. 1 shows a lens element section of a first exemplary embodiment of an optical system according to the disclosure.

FIG. 1 depicts the lens element section of a first exemplary embodiment of an optical system provided with the general reference sign 10. The optical system 10 has a lens element system 11 which has a Fourier optical unit 12 having four lens element groups 14a,b,c,d, wherein the lens element groups 14a,b,c,d are arranged in a rotationally symmetric manner about an optical axis 16. Calcium fluoride and quartz glass or silicon dioxide are used as lens element material in this exemplary embodiment. At an operating wavelength of 193.3 nm, calcium fluoride has a refractive index of 1.5014, while silicon dioxide has a refractive index of 1.5603 at the same operating wavelength. The Fourier optical unit 12 has a stop plane 18, which has a diameter of 5 mm. The Fourier optical unit 12 further has an image plane 20, wherein the four lens element groups 14a,b,c,d are arranged between the stop plane 18 and the image plane 20 in a manner that is rotationally symmetrical about the optical axis 16.

For an operating wavelength of 190-250 nm, the Fourier optical unit 12 has a characteristic focal length of 100 mm.

Parallel pencils of rays enter into the optical system 10 through the stop plane 18, the pencils of rays emanating from an object not shown here, which is situated at an infinite distance upstream of the stop plane 18, and pass through the four lens element groups 14a,b,c,d and finally are focused onto a plurality of image points 21 in the image plane 20. As a result of the lens element groups 14a,b,c,d, the object is imaged into an image field 20a in the image plane 20, with the image field 20a having a diameter of 5 mm. Within the image field 20a, the geometric diameter of the image points 21 is less than 0.2 µm, with the correction of the field imaging being so good that the size of the diameter of the image points 21 is substantially determined by diffraction. The 'geometric diameter' should be understood to be the geometric spot diameter when diffraction is ignored. A plurality of pencils of rays are plotted in addition to the Fourier optical unit 12. The image field 20a and the stop plane 18 have the same size. The stop plane 18 is likewise imaged by the lens element groups 14a,b,c,d, wherein the stop plane has an exit pupil that is situated at an infinite distance after the stop plane 18 (not shown here).

Figure 3:
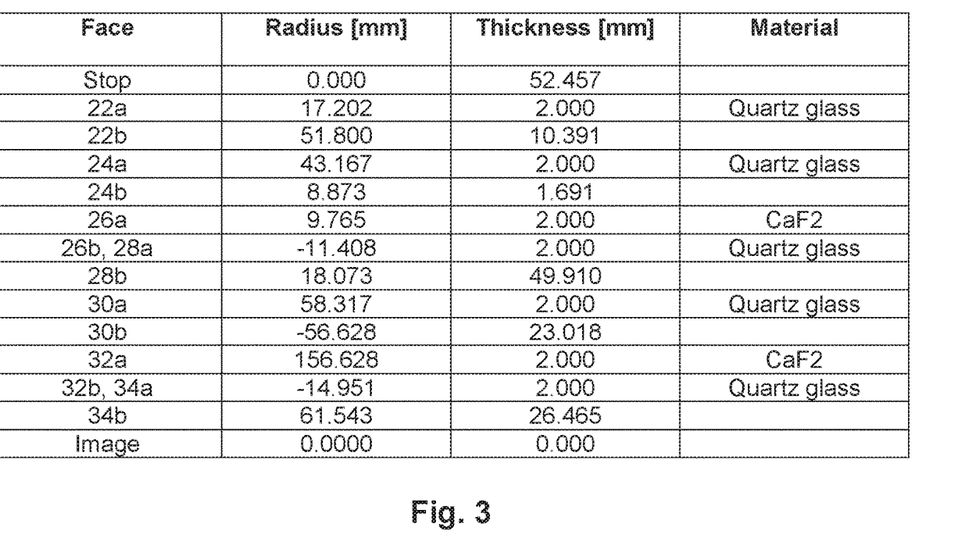
FIG. 3 shows a table with the system data of the optical system in FIG. 1.

The system data, in particular the radii of curvature, distances between adjacent faces and the lens element materials for the individual optical elements of the optical system 10 in FIG. 1, are combined in the table in FIG. 3.

As seen from the stop plane 18, the Fourier optical unit 12 has the first lens element group 14a, which is embodied as a concave-convex converging lens element 22 with positive refractive power. The first lens element group 14a has a convex face 22a facing the stop plane 18 and a concave face 22b facing away from the stop plane 18, the convex face 22a having a radius of curvature of 17.2 mm. The concave-convex converging lens element 22 has quartz glass as a lens element material, wherein it 22 is arranged at a distance of 52.5 mm from the stop plane 18 in a rotationally symmetric manner about the optical axis 16.

The Fourier optical unit 12 has, as seen from the stop plane 18, the second lens element group 14b after the first lens element group 14a, the second lens element group having, in a sequence from the stop plane 18 a concave-convex diverging lens element 24 with a convex face 24a facing the stop plane 18 and a concave face 24b facing away from the stop plane 18, a biconvex converging lens element 26 and a biconcave diverging lens element 28, wherein the biconvex converging lens element 26 is joined or cemented to the biconcave diverging lens element 28 at a distance from the concave-convex diverging lens element 24 along the optical axis 16. The concave-convex diverging lens element 24 has a refractive power of −50 dpt, with its concave face 24b having a radius of curvature of 8.9 mm. The concave-convex diverging lens element 24 further has quartz glass as a lens element material, with the lens element being arranged in a rotationally symmetric manner about the optical axis 16. The biconvex converging lens element 26 has a convex face 26a facing the stop plane 18 and a convex face 26b facing away from the stop plane 18. As a lens element material, the biconvex converging lens element 26 has $CaF_2$, wherein it is arranged in a rotationally symmetric manner about the optical axis 16. The biconcave diverging lens element 28 joined to the biconvex converging lens element 26 in a rotationally symmetric manner about the optical axis 16 has a concave face 28a facing the stop plane 18 and a concave face 28b facing away from the stop plane 18, with the convex face 26b being connected to the concave face 28a. The biconcave diverging lens element 28 has quartz glass as lens element material.

As seen from the stop plane 18, the Fourier optical unit 12 has the third lens element group 14c, which is embodied as a biconvex converging lens element 30 with positive refractive power. The biconvex converging lens element 30 has a convex face 30a facing the stop plane 18 and a convex face 30b facing away from the stop plane 18. The biconvex converging lens element 30 has quartz glass as a lens element material, with the lens element being arranged in a rotationally symmetric manner about the optical axis 16.

As seen from the stop plane 18, the Fourier optical unit 12 has the fourth lens element group 14d which, as seen from the stop plane 18, has in succession a biconvex converging lens element 32 and a biconcave diverging lens element 34 joined thereto along the optical axis 16. The converging lens element 32 has a convex face 32a facing the stop plane 18 and a convex face 32b facing away from the stop plane 18. The diverging lens element 34 has a concave face 34a facing the stop plane and a concave face 34b facing away from the stop plane 18, with the convex face 32a being connected to the concave face 34a. As a lens element material, the biconvex converging lens element 32 has CaF2. As a lens element material, the biconcave diverging lens element 34 has quartz glass, wherein the lens element 34 is arranged in a rotationally symmetric manner about the optical axis 16.

The first and the third lens element group 14a,c of the Fourier optical unit 12 are embodied as color under-corrected lens element groups in relation to the longitudinal chromatic aberration of the field imaging, while the second and the fourth lens element group 14b,d of the Fourier optical unit 12 are embodied as color over-corrected lens element groups in relation to the longitudinal chromatic aberration in the field imaging. The Fourier optical unit 12 of this exemplary embodiment can be used for the wavelength range of between 190 and 250 nm, wherein the primary longitudinal chromatic aberration, the primary transverse chromatic aberration and the secondary longitudinal chromatic aberration are corrected in the field imaging and in the pupil imaging, with the field imaging being corrected better in this case than the pupil imaging. The two image points 21 on the image plane 20 each have a geometric diameter of <0.2 μm, indicating that the aforementioned chromatic aberrations for the field imaging can be largely corrected by the Fourier optical unit 12.

Figure 2:
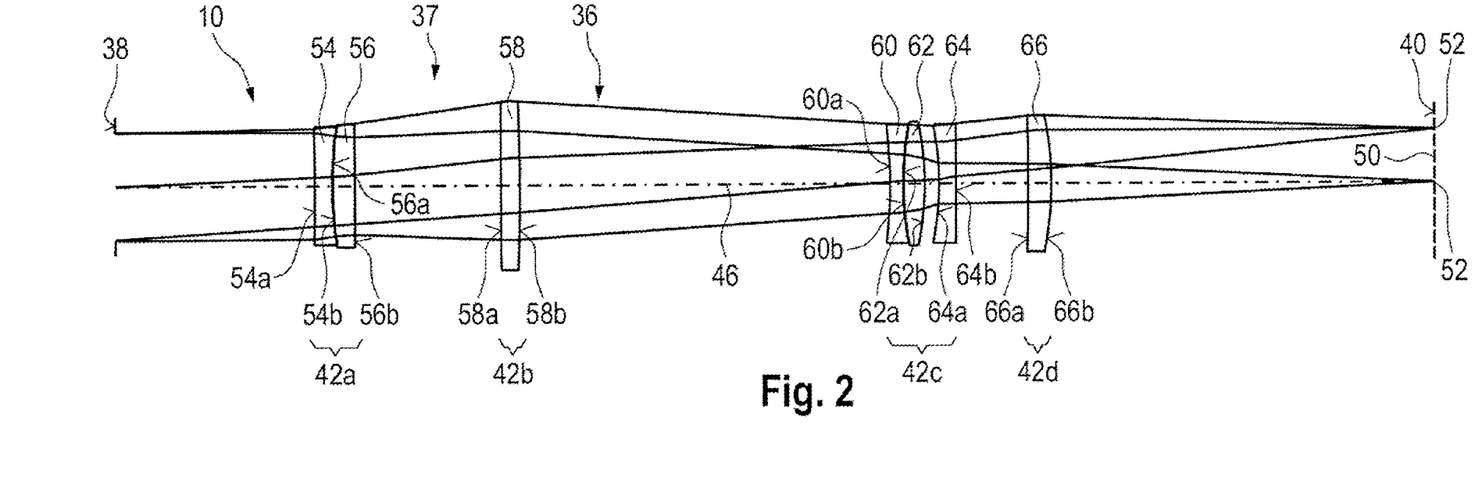
FIG. 2 shows a lens element section of a second exemplary embodiment of an optical system according to the disclosure.

FIG. 2 shows the lens element section of a second exemplary embodiment of an optical system 10 according to the disclosure of FIG. 1, the optical system having a lens element system 37 having a Fourier optical unit 36 with a stop plane 38 and an image plane 40. The Fourier optical unit 36 further has four lens element groups 42a,b,c,d, wherein the four lens element groups 42a,b,c,d emerge from mirroring the four lens element groups 14a,b,c,d from FIG. 1 about a plane 44 that is perpendicular to the optical axis 16 (FIG. 1). The four lens element groups 42a,b,c,d are arranged in a rotationally symmetric manner about an optical axis 46 in FIG. 2, wherein they are arranged at a distance from one another and from the stop plane 38 and from the image plane 40 in a manner corresponding to the mirroring about the central plane 44 (FIG. 1). The first and third lens element group 42a,c, as seen from the stop plane 38, are in each case embodied as color over-corrected lens element groups in relation to the longitudinal chromatic aberration of the pupil imaging, while the second and fourth lens element group 42b,d, as seen from the stop plane 38, are in each case embodied as a color under-corrected lens element group in relation to the longitudinal chromatic aberration in the pupil imaging. Like in FIG. 1, in this exemplary embodiment, too, an object (not shown here) lies at infinity, the object being imaged by the lens element groups 42a,b,c,d into the image plane 40 onto an image field 50. The stop plane 38 is imaged onto an exit pupil (not shown here) by the lens element groups 42a,b,c,d, wherein the stop plane 38 and the image field 50 have the same size. The exit pupil is situated at an infinite distance behind the stop plane 40 in this exemplary embodiment.

Figure 4:
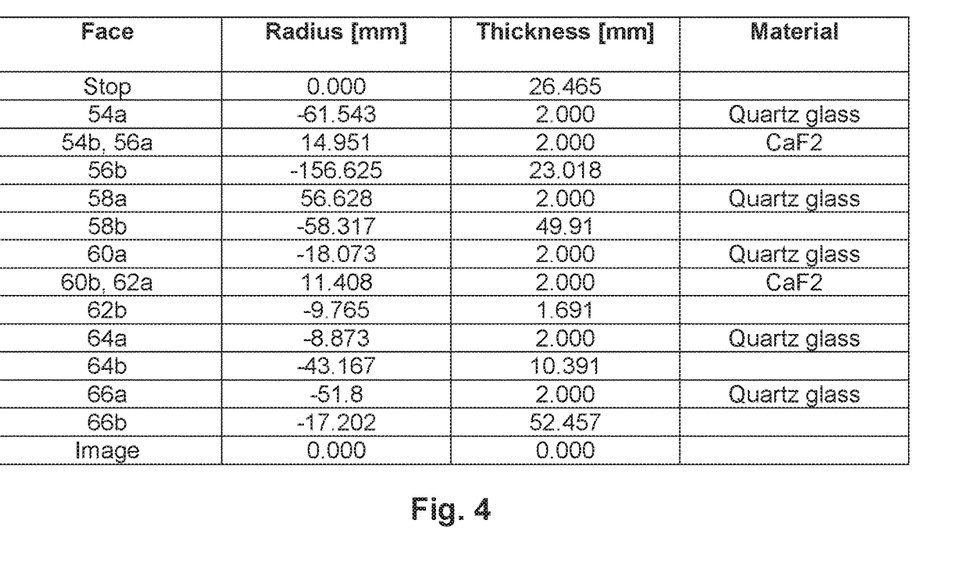
FIG. 4 shows a table with the system data of the optical system in FIG. 2.

The system data, in particular the radii of curvature, distances between adjacent faces and the lens element materials for the individual optical elements of the optical system 10 in FIG. 2, are combined in the table in FIG. 4.

The first lens element group 42a, as seen from the stop plane 38, has, in a sequence from the stop plane 38, a biconcave diverging lens element 54, which has the same structure as the biconcave diverging lens element 34, and a biconvex converging lens element 56, which has the same structure as the biconvex converging lens element 32, wherein the converging lens element 56 is joined to the diverging lens element 54 along the optical axis 46. The diverging lens element 54 has a face 54a facing the stop plane 38 and a concave face 54b facing away from the stop plane 38. The converging lens element 56 has a convex face 56a facing the stop plane 38 and a face 56b facing away from the stop plane 38, with the convex face 56a being connected to the concave face 54b. The biconcave diverging lens element 54 is arranged in a rotationally symmetric manner about the optical axis 46, wherein the biconvex converging lens element 56 is likewise arranged in a rotationally symmetric manner about the optical axis 46.

The second lens element group 42b, as seen from the stop plane 38, has a biconvex converging lens element 58, which has the same structure as the biconvex converging lens element 30, with positive refractive power. The biconvex converging lens element 58 has a convex face 58a facing the stop plane 38, the convex face corresponding to the convex face 30b of the biconvex converging lens element 30. Further, the biconvex converging lens element 58 has a convex face 58b facing away from the stop plane 38, the convex face corresponding to the convex face 30a of the biconvex converging lens element 30. The biconvex converging lens element 58 is arranged in a rotationally symmetric manner about the optical axis 46.

The third lens element group 42c, as seen from the stop plane 38, has a biconcave diverging lens element 60, which has the same structure as the biconcave diverging lens element 28, a biconvex converging lens element 62, which has the same structure as the biconvex converging lens element 26, and a concave-convex diverging lens element 64, which has the same structure as the concave-convex diverging lens element 24. The biconcave diverging lens element 60 is joined to the biconvex converging lens element 62 at a distance from the concave-convex diverging lens element 64 along the optical axis 46. The biconcave diverging lens element 60 is arranged in a rotationally symmetric manner about the optical axis 46 and has a concave face 60a facing the stop plane 38 and a concave face 60b facing away from the stop plane 38, wherein the concave face 60a corresponds to the concave face 28b and the concave face 60b corresponds to the concave face 28a. The biconvex converging lens element 62 is arranged in a rotationally symmetric manner about the optical axis 46 and has a convex face 62a facing the stop plane 38 and a convex face 62b facing away from the stop plane 38, wherein the convex face 62a corresponds to the convex face 26b and the convex face 62b corresponds to the convex face 26a. The concave-convex diverging lens element 64 is arranged in a rotationally symmetric manner about the optical axis 46 and has a concave face 64a facing the stop plane 38, the concave face corresponding to the concave face 24b.

The fourth lens element group 42d, as seen from the stop plane 38, has a concave-convex converging lens element 66, which has the same structure as the concave-convex converging lens element 22, with positive refractive power, which has a concave face 66a facing the stop plane 38 and a convex face 66b facing away from the stop plane 38. The concave-convex converging lens element 66 is arranged in a rotationally symmetric manner about the optical axis 46.

Figure 5:
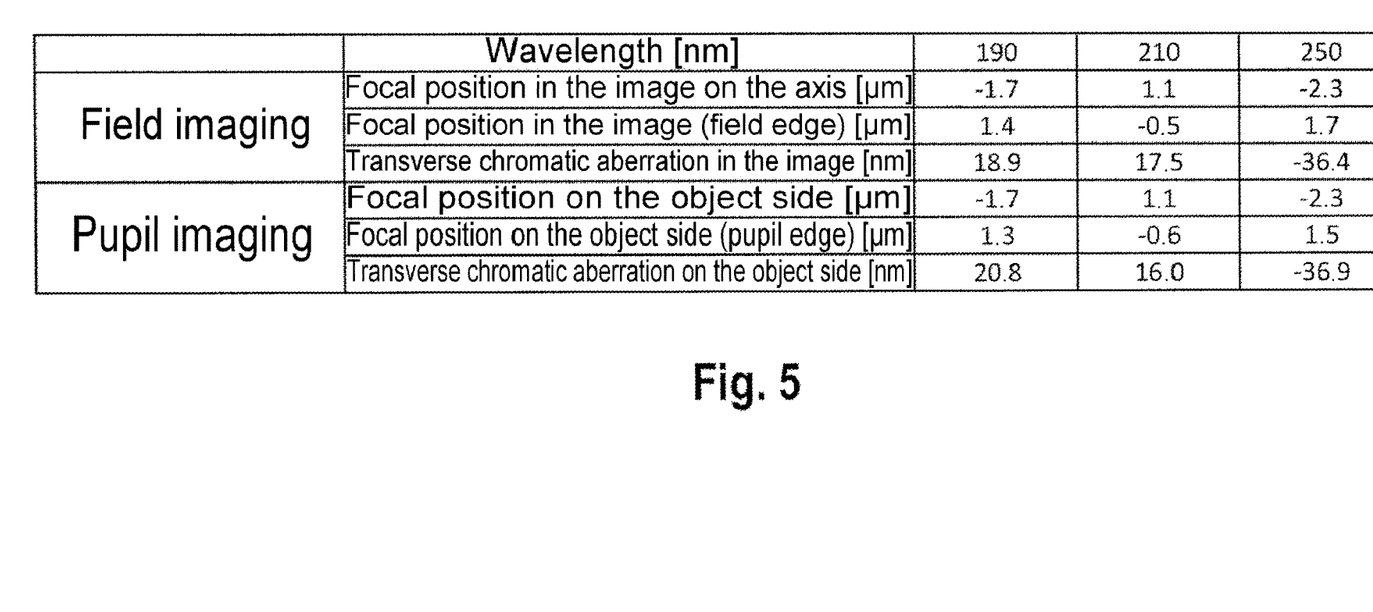
FIG. 5 shows a table with color corrections by way of the optical system in FIG. 2.

A table can be seen in FIG. 5, the table showing the chromatic corrections that are obtainable with the optical system 10 shown in FIG. 2. Relating to the optical wavelengths of 190 nm, 210 nm and 250 nm, the chromatic corrections are specified both for the field imaging and for the pupil imaging.

It is clear from FIG. 5 that the displacement of the focal position in the image along the optical axis in the case of the field imaging lies in the range of −2.3 μm to 1.1 μm for these wavelengths, with the positive/negative sign corresponding to displacement away from the image plane/toward the image plane. The displacement of the focal position in the image at the field edge lies in the range of −0.5 μm to 1.7 μm in the case of field imaging. Moreover, the transverse chromatic aberrations in the image lie in the range from −36.4 nm to 18.9 nm in the case of field imaging, with the positive/negative sign here corresponding to the vertical direction of the image point displacement in the upward/downward direction.

A displacement of the focal position on the object side along the optical axis of −2.3 μm to 1.1 μm arises in the case of pupil imaging. The displacement of the focal position on the object side at the pupil edge lies in the range of −0.6 μm to 1.5 μm in the case of pupil imaging. Moreover, the transverse chromatic aberrations on the object side lie in the range from −36.9 nm to 20.8 nm in the case of pupil imaging, with the positive/negative sign here corresponding to the vertical direction of the image point displacement in the upward/downward direction.

Using the present disclosure, it is possible to obtain significantly better chromatic corrections in comparison with the apparatuses known from the prior art. By way of example, the primary longitudinal chromatic aberration of a simple lens element made of quartz glass with a focal length of 100 mm lies at 11.2 μm. The secondary longitudinal chromatic aberration of a simple achromat made of quartz glass and $CaF_2$ with a focal length of 100 mm is 255 μm.

The field imaging in FIG. 1 corresponds to the pupil imaging in FIG. 2, while the pupil imaging in FIG. 1 corresponds to the field imaging in FIG. 2. The Fourier optical unit 36 can be used for the wavelength range of between 190 and 250 nm, wherein the primary longitudinal chromatic aberration, the primary transverse chromatic aberration and the secondary longitudinal chromatic aberration are corrected in the pupil imaging and in the field imaging, with the pupil imaging being corrected better in this case than the field imaging. The pencils of rays plotted in FIG. 2 are focused onto a plurality of image points 52 in the image plane 40, wherein the image points 52 each have a geometric diameter of <0.2 μm. This means that the aforementioned chromatic aberrations for the pupil imaging can be largely corrected by the Fourier optical unit 36.

What is claimed is:

1. An optical system having an optical axis, a stop plane and an image plane, the optical system comprising:
    a Fourier optical unit comprising four lens element groups spaced from each other along an optical axis of the optical system between a stop plane of the optical system and an image plane of the optical system,
    wherein:
        each of the four lens element groups comprises a lens element;
        each of the four lens element groups comprises a first lens element material and/or a second lens element material that differs from the first lens element material;
        the four lens element groups comprise:
            a first color under-corrected lens element group in relation to a chromatic longitudinal aberration of field imaging of the optical system and/or pupil imaging of the optical system;
            a second color under-corrected lens element group in relation to the chromatic longitudinal aberration of the field imaging of the optical system and/or the pupil imaging of the optical system;
            a first color over-corrected lens element group; and
            a second color over-corrected lens element group;
        each of the first and second color under-corrected lens element groups has a positive refractive power;
        each of the first and second color over-corrected lens element groups has a negative refractive power; and
        the Fourier optical unit comprises an alternating sequence of color under-corrected and color over-corrected lens element groups.

2. The optical system of claim 1, wherein the first color under-corrected lens element group comprises only one lens element, and/or the second color under-corrected lens element group comprises only one lens element.

3. The optical system of claim 1, wherein the first color under-corrected lens element group comprises only one material, and/or the second color under-corrected lens element group comprises only one material.

4. The optical system of claim 1, wherein the first color over-corrected lens element group comprises at least two lens elements, and/or the second color over-corrected lens element group comprises at least two lens elements.

5. The optical system of claim 1, wherein the first over-corrected lens element group comprises two materials, and/or the second color over-corrected lens element group comprises two materials.

6. The optical system of claim 1, wherein, when an object and/or an exit pupil are situated at an infinite distance from the stop plane, the stop plane and an image field have substantially the same size.

7. The optical system of claim 1, wherein the first color under-corrected lens element group is disposed upstream of: the second color under-corrected lens element group; the first color over-corrected lens element group; and the second color over-corrected lens element group.

8. The optical system of claim 1, wherein the first color under-corrected lens element group comprises a concave-convex converging lens element with positive refractive power, and the concave-convex converging lens element comprises a convex face facing the stop plane.

9. The optical system of claim 1, wherein:
    the second color under-corrected lens element group comprises a biconvex converging lens element with positive refractive power; and
    the first color under-corrected lens element group is disposed upstream of: the second color under-corrected lens element group; the first color over-corrected lens element group; and second color over-corrected lens element group.

10. The optical system of claim 1, wherein the first color over-corrected lens element group is disposed upstream of the second color over-corrected lens element group.

11. The optical system of claim 1, wherein:
    the first color over-corrected lens element group, comprises, in a sequence from the stop plane:
        a concave-convex diverging lens element with a concave face facing away from the stop plane;
        a biconvex converging lens element; and
        a biconcave diverging lens element joined to the biconcave diverging lens element at a distance from the concave-convex diverging lens element along the optical axis.

12. The optical system of claim 1, wherein:
    the second color over-corrected lens element group comprises, in a sequence from the stop plane:
        a biconvex converging lens element comprising a convex face facing away from the stop plane; and
        a biconcave diverging lens element joined to plano-convex converging lens element along the optical axis; and
    the biconcave diverging lens element comprises a concave face facing the stop plane.

13. The optical system of claim 1, wherein the first color over-corrected lens element group is upstream of: the second color over-corrected lens element group; the first under-corrected lens element group; and the second color under-corrected lens element group.

14. The optical system of claim 1, wherein:
the first color over-corrected lens element group comprises, in a sequence from the stop plane:
a biconcave diverging lens element comprising a concave face facing away from the stop plane; and
a biconvex converging lens element joined to the plano-concave diverging lens along the optical axis; and
the biconvex converging lens element comprises a convex face facing the stop plane.

15. The optical system of claim 1, wherein:
the second color over-corrected lens element group comprises, in a sequence from the stop plane:
a biconcave diverging lens element;
a biconvex converging lens element; and
a concave-convex diverging lens element comprising a concave face facing the stop plane; and
the biconvex converging lens element is joined to the biconcave diverging lens element at a distance from the concave-convex diverging lens element along the optical axis.

16. The optical system of claim 1, wherein the first color under-corrected lens element group is disposed upstream of the second color under-corrected lens element group.

17. The optical system of claim 1, wherein the second color under-corrected lens element group comprises a concave-convex converging lens element with positive refractive power, and the concave-convex converging lens element comprises a convex face facing away from the stop plane.

18. The optical system of claim 1, wherein the first and second materials comprise silicon dioxide and calcium fluoride.

19. The optical system of claim 1, wherein the Fourier optical unit comprises a further optical element.

20. An optical system for field imaging and/or pupil imaging, the optical system having an optical axis, a stop plane and an image plane, the optical system comprising:
a lens element system comprising three lens element groups, each with at least one lens element, the lens element groups being arranged spaced apart from one another along the optical axis between the stop plane and the image plane, wherein the three lens element groups comprise a first lens element material and/or a second lens element material that differs from the first lens element material,
wherein:
the lens element system is embodied as a Fourier optical unit;
the Fourier optical unit further comprises a further lens element group;
the further lens element group comprises at least one lens element;
the further lens element group is at a distance from the three lens element groups along the optical axis between the stop plane and the image plane;
the further lens element group comprises the first lens element material and/or the second lens element material;
two of the four lens element groups of the Fourier optical unit are embodied as a first and a second color under-corrected lens element group in relation to a chromatic longitudinal aberration of the field imaging and/or the pupil imaging;
each of the first and second color under-corrected lens element groups has a positive refractive power;
two other of the four lens element groups of the Fourier optical unit are embodied as a first and a second color over-corrected lens element group;
each of the first and second color over-corrected lens element groups has a negative refractive power; and
the Fourier optical unit has an alternating sequence of in each case color under-corrected and color over-corrected lens element group.

* * * * *

UNITED STATES PATENT AND TRADEMARK OFFICE
CERTIFICATE OF CORRECTION

| | |
|---|---|
| PATENT NO. | : 10,656,411 B2 |
| APPLICATION NO. | : 15/927647 |
| DATED | : May 19, 2020 |
| INVENTOR(S) | : Holger Muenz |

It is certified that error appears in the above-identified patent and that said Letters Patent is hereby corrected as shown below:

In the Specification

Column 8, Line 15, delete "18" and insert -- 18, --.

Signed and Sealed this
Seventh Day of July, 2020

Andrei Iancu
*Director of the United States Patent and Trademark Office*